(12) United States Patent
Ha et al.

(10) Patent No.: US 11,245,070 B2
(45) Date of Patent: Feb. 8, 2022

(54) ELECTRONIC DEVICE AND METHOD FOR FABRICATING THE SAME

(71) Applicant: SK hynix Inc., Icheon-si (KR)

(72) Inventors: Ga-Young Ha, Icheon-si (KR); Ki-Seon Park, Seoul (KR); Jong-Han Shin, Seoul (KR)

(73) Assignee: SK hynix Inc., Icheon-si (KR)

( * ) Notice: Subject to any disclaimer, the term of this patent is extended or adjusted under 35 U.S.C. 154(b) by 180 days.

(21) Appl. No.: 16/426,475

(22) Filed: May 30, 2019

(65) Prior Publication Data

US 2019/0280199 A1    Sep. 12, 2019

Related U.S. Application Data

(62) Division of application No. 15/703,901, filed on Sep. 13, 2017, now Pat. No. 10,333,061.

(30) Foreign Application Priority Data

Dec. 22, 2016    (KR) .................... 10-2016-0176518

(51) Int. Cl.
*H01L 21/00* (2006.01)
*H01L 43/12* (2006.01)
*H01L 27/22* (2006.01)
*H01L 43/08* (2006.01)

(52) U.S. Cl.
CPC ............ *H01L 43/12* (2013.01); *H01L 27/222* (2013.01); *H01L 27/228* (2013.01); *H01L 43/08* (2013.01)

(58) Field of Classification Search
CPC ..... H01L 43/12; H01L 27/222; H01L 27/228; H01L 43/08
See application file for complete search history.

(56) References Cited

U.S. PATENT DOCUMENTS

| | | | |
|---|---|---|---|
| 9,741,415 B2 * | 8/2017 | Han | ................ H01L 27/222 |
| 9,876,162 B2 * | 1/2018 | Kim | ................ H01L 27/224 |
| 2015/0021726 A1 | 1/2015 | Min et al. | |
| 2016/0035969 A1 | 2/2016 | Kang et al. | |
| 2016/0172585 A1 | 6/2016 | Guo | |

FOREIGN PATENT DOCUMENTS

| KR | 10-0487927 | 5/2005 |
|---|---|---|
| KR | 10-1127766 | 3/2012 |

\* cited by examiner

*Primary Examiner* — Richard A Booth
(74) *Attorney, Agent, or Firm* — Perkins Coie LLP

(57) ABSTRACT

An electronic device including a semiconductor memory. The semiconductor memory may include a variable resistance element. The variable resistance element may include a first magnetic layer formed over a first auxiliary layer, a tunnel barrier layer formed over the first magnetic layer, a second magnetic layer formed over the tunnel barrier layer, a second auxiliary layer formed over the second magnetic layer, and a hard mask formed over the second auxiliary layer. Side surfaces of the first magnetic layer may be substantially aligned with side surfaces of the first auxiliary layer, and the side surfaces of the first magnetic layer may deviate from side surfaces of the hard mask.

16 Claims, 20 Drawing Sheets

ELECTRONIC DEVICE AND METHOD FOR FABRICATING THE SAME

CROSS-REFERENCE TO RELATED APPLICATION

This patent document is a divisional of, and claims priority and benefits of, U.S. patent application Ser. No. 15/703,901, published as US 2018/0182956 A1, entitled "ELECTRONIC DEVICE AND METHOD FOR FABRICATING THE SAME," and filed on Sep. 13, 2017, which further claims priority of Korean Patent Application No. 10-2016-0176518, entitled "ELECTRONIC DEVICE AND METHOD OF FORMING THE SAME" and filed on Dec. 22, 2016. The contents of the before-mentioned patent applications (including US 2018/0182956 A1) are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one implementation, an electronic device may include a semiconductor memory, and the semiconductor memory may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask.

Implementations of the above electronic device may include one or more the following.

Side surfaces of the second magnetic layer, side surfaces of the second auxiliary layer, and the side surfaces of the hard mask may be substantially aligned with one another. A horizontal width of the first magnetic layer may be smaller than a horizontal width of the hard mask. The electronic device may further include a first oxidation pattern formed on the side surfaces of the first auxiliary layer and including an oxide of a material included in the first auxiliary layer; and a second oxidation pattern formed on the side surfaces of the first magnetic layer and including an oxide of a material included in the first magnetic layer. Outer side surfaces of the first oxidation pattern and the second oxidation pattern may be substantially aligned with the side surfaces of the hard mask. A vertical center axis of the first magnetic layer may deviate from a vertical center axis of the hard mask. Side surfaces of the second auxiliary layer may be substantially aligned with the side surfaces of the hard mask, side surfaces of the second magnetic layer may deviate from the side surfaces of the second auxiliary layer, and the side surfaces of the first magnetic layer may be substantially flush with the side surfaces of the second magnetic layer. The electronic device may further include a third oxidation pattern formed on side surfaces of the second magnetic layer and including an oxide of a material included in the second magnetic layer. Outer side surfaces of the third oxidation pattern may be substantially aligned with the side surfaces of the hard mask. Vertical center axes of the first magnetic layer and the second magnetic layer may deviate from vertical center axes of the second auxiliary layer and the hard mask. The first magnetic layer may have one of a fixed magnetization and a variable magnetization, and the second magnetic layer may have the other one of the fixed magnetization and the variable magnetization. The first auxiliary layer may include an electrode layer, a seed layer, a spacer layer, a magnetic correction layer, a shift cancelling layer (SCL), or an etch stop layer, or a combination thereof, and the second auxiliary layer may include the electrode layer, the seed layer, the spacer layer, the magnetic correction layer, the SCL, the etch stop layer, or a capping layer, or a combination thereof.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device is provided to include: forming a first auxiliary layer and a first magnetic layer over a substrate; forming a tunnel barrier layer over the first magnetic layer; forming a first oxidation pattern in the first auxiliary layer and a second oxidation pattern in the first magnetic layer, respectively, through an ion implantation process using oxygen; forming a second magnetic layer and a second auxiliary layer over the tunnel barrier layer; forming a hard mask layer over the second auxiliary layer; patterning the second auxiliary layer and the second magnetic layer by using the hard mask as an etch mask; and patterning the tunnel barrier layer, the second oxidation pattern, and the first oxidation pattern by using the hard mask as an etch mask.

In another aspect, a method for fabricating an electronic device including a semiconductor memory may include: providing a substrate; forming a stacked structure over the first magnetic layer to include a first auxiliary layer, a first magnetic layer, and a tunnel barrier layer; forming a second magnetic layer over the tunnel barrier layer; forming a second auxiliary layer over the second magnetic layer; forming a hard mask layer over the second auxiliary layer; and patterning the second auxiliary layer, the second magnetic layer, and the stacked structure by using the hard mask as an etch mask, wherein the method further includes forming an oxidation pattern in the stacked structure through an ion implantation process using oxygen.

Implementations of the above method for fabricating the electronic device may include one or more the following.

The forming of the oxidation pattern includes, prior to the forming of the second magnetic layer, forming a first oxidation pattern in the first auxiliary layer and a second oxidation pattern in the first magnetic layer, respectively. The first oxidation pattern may adjoin the first auxiliary layer on both sides of the first auxiliary layer and includes an oxide of a material included in the first auxiliary layer, and the second oxidation pattern may adjoin the first magnetic layer on both sides of the first magnetic layer and includes an oxide of a material included in the first magnetic layer. Side surfaces of the first magnetic layer may be substantially aligned with side surfaces of the first auxiliary layer, and the side surfaces of the first magnetic layer may deviate from side surfaces of the hard mask. Side surfaces of the second magnetic layer, the second auxiliary layer, and the hard mask may be substantially aligned with one another, and a horizontal width of the first magnetic layer may be smaller than a horizontal width of the hard mask. Outer side surfaces of the first oxidation pattern and the second oxidation pattern may be substantially aligned with side surfaces of the hard mask. A vertical center axis of the first magnetic layer may deviate from a vertical center axis of the hard mask. The tunnel barrier layer may be formed after or before the forming of the first oxidation pattern and the second oxidation pattern. The first magnetic layer may have one of a fixed magnetization and a variable magnetization, and the second magnetic layer may have the other one of the fixed magnetization and the variable magnetization. The first auxiliary layer may include an electrode layer, a seed layer, a spacer layer, a magnetic correction layer, a shift cancelling layer (SCL), or an etch stop layer, or a combination thereof, and the second auxiliary layer may include the electrode layer, the seed layer, the spacer layer, the magnetic correction layer, the SCL, the etch stop layer, or a capping layer, or a combination thereof. The forming of the oxidation pattern may include, after the forming of the second magnetic layer, forming the oxidation pattern in at least one of the first auxiliary layer and the first magnetic layer. The method may further include forming an additional oxidation pattern in the second magnetic layer through an ion implantation process using oxygen. The forming of the additional oxidation patterns may include implanting oxygen into the second magnetic layer. The additional oxidation pattern may adjoin the second magnetic layer on both sides of the second magnetic layer and include an oxide of a material included in the second magnetic layer. Outer side surfaces of the additional oxidation pattern may be substantially aligned with outer side surfaces of the first oxidation pattern and the second oxidation pattern. Side surfaces of the second auxiliary layer may be substantially aligned with side surfaces of the hard mask, side surfaces of the second magnetic layer may deviate from the side surfaces of the second auxiliary layer, and side surfaces of the first magnetic layer may be substantially aligned with the side surfaces of the second magnetic layer.

In another aspect, a method for fabricating an electronic device is provided to include: forming a first auxiliary layer over a substrate; forming a first magnetic layer over the first auxiliary layer; forming a tunnel barrier layer over the first magnetic layer; forming a second magnetic layer over the tunnel barrier layer; forming oxidation patterns in at least two layers of the first auxiliary layer, the first magnetic layer, and the second magnetic layer through an ion implantation process using oxygen; forming a second auxiliary layer over the second magnetic layer; forming a hard mask over the second auxiliary layer; and patterning the second auxiliary layer, the second magnetic layer, the tunnel barrier layer, the first magnetic layer, the first auxiliary layer, and the oxidation patterns by using the hard mask as an etch mask.

In some implementations, the forming of the oxidation patterns comprises: forming a mask pattern over the second magnetic layer, implanting oxygen into the first auxiliary layer, the first magnetic layer, and the second magnetic layer by using the mask pattern as a mask, and removing the mask pattern. In some implementations, the oxidation patterns comprise: a first oxidation pattern formed on side surfaces of the first auxiliary layer and including an oxide of a material included in the first auxiliary layer; a second oxidation pattern formed on side surfaces of the first magnetic layer and including an oxide of a material included in the first magnetic layer; and a third oxidation pattern formed on side surfaces of the second magnetic layer and including an oxide of a material included in the second magnetic layer. In some implementations, outer side surfaces of the first oxidation pattern, the second oxidation pattern, and the third oxidation pattern are substantially flush with side surfaces of the hard mask. In some implementations, side surfaces of the second auxiliary layer are substantially flush with side surfaces of the hard mask, In some implementations, side surfaces of the second magnetic layer deviate from the side surfaces of the second auxiliary layer, and side surfaces of the first magnetic layer are substantially flush with the side surfaces of the second magnetic layer. In some implementations, a horizontal width of the second magnetic layer is smaller than a horizontal width of the hard mask. In some implementations, vertical center axes of the first magnetic layer and the second magnetic layer deviate from vertical center axes of the second auxiliary layer and the hard mask. In some implementations, the forming of the oxidation patterns comprises: forming a mask pattern over the tunnel barrier layer, implanting oxygen into the first auxiliary layer and the first magnetic layer by using the mask pattern as a mask, and removing the mask pattern. In some implementations, side surfaces of the first magnetic layer are substantially flush with side surfaces of the first auxiliary layer, and the side surfaces of the first magnetic layer deviate from side surfaces of the hard mask. In some implementations, side surfaces of the second magnetic layer, the second auxiliary layer, and the hard mask are substantially flush with one another, and a horizontal width of the first magnetic layer is smaller than a horizontal width of the hard mask.

These and other aspects, implementations and associated advantages are described in greater detail in the drawings, the description and the claims.

DETAILED DESCRIPTION

Figure 1:
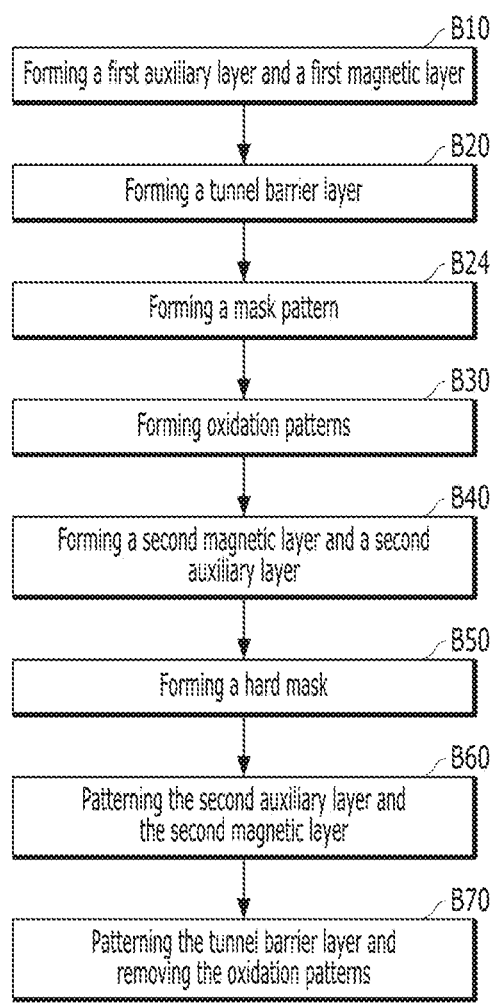
FIG. 1 is a flow-chart explaining a method for fabricating a semiconductor device including a variable resistance element based on an implementation of the disclosed technology.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers can be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

An electronic device in accordance with implementations of the present disclosure may include a semiconductor memory or a semiconductor device including a variable resistance element. In some implementations, the variable resistance element may include a MTJ (Magnetic Tunnel Junction) structure. The semiconductor memory or the semiconductor device may include an STT-RAM (Spin Transfer Torque Random Access Memory) and an MRAM (Magnetic Random Access Memory).

The MTJ structure may include a plurality of metal compound layers. A variety of problems may occur during a process for patterning the plurality of metal compound layers. For example, conductive by-products generated by an etch process may be re-deposited on sidewalls of the MTJ structure, which becomes a cause for defects of the electronic device. For example, the conductive by-products redeposited may results in problems such as an increase of write error rate (WER, WERO) or shunt failure. Accordingly, new technologies are needed to improve properties and processes of the variable resistance element including the MTJ structure.

FIG. 1 is a flow-chart explaining a method for fabricating a semiconductor device including a variable resistance element based on an implementation of the disclosed technology. FIGS. 2 to 11 are cross-sectional views illustrating the method for fabricating the semiconductor device and a related electronic device.

Referring to FIG. 1, the method for fabricating the semiconductor device including the variable resistance element based on the implementation of the disclosed technology may include forming a first auxiliary layer and a first magnetic layer (B10), forming a tunnel barrier layer (B20), forming a mask pattern (B24), forming oxidation patterns (B30), forming a second magnetic layer and a second auxiliary layer (B40), forming a hard mask (B50), patterning the second auxiliary layer and the second magnetic layer (B60), and patterning the tunnel barrier layer and removing the oxidation patterns (B70).

Figure 2:
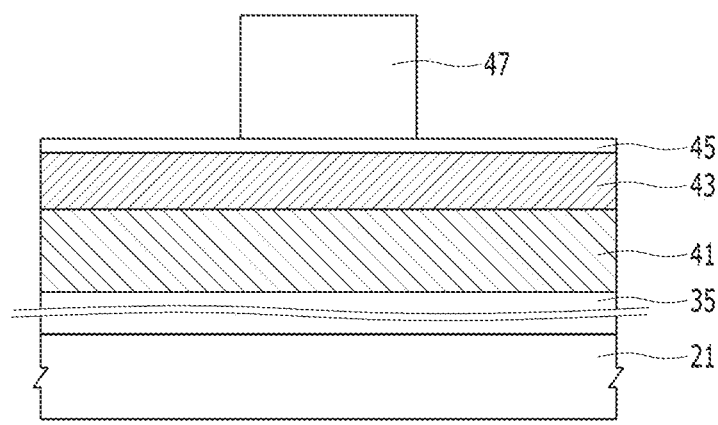
FIGS. 2 to 11 are cross-sectional views illustrating a method for fabricating a semiconductor device including a variable resistance element and a related electronic device based on an implementation of the disclosed technology.

Referring to FIGS. 1 and 2, a first dielectric layer 35 may be formed over a substrate 21. A first auxiliary layer 41 and a first magnetic layer 43 may be formed over the first dielectric layer 35 (B10). A tunnel barrier layer 45 may be formed over the first magnetic layer 43 (B20). A mask pattern 47 may be formed over the tunnel barrier layer 45 (B24).

The first auxiliary layer 41 may include a lower electrode layer, a seed layer, a spacer layer, a magnetic correction layer, a shift cancelling layer (SCL) or an etch stop layer, or a combination thereof. The first auxiliary layer 41 may correspond to an under layer (UL). In some implementations, the first auxiliary layer 41 may include an AlN layer.

The first magnetic layer 43 may include a free layer or a pinned layer. Hereinbelow, an example in which the first magnetic layer 43 includes the free layer will be exemplarily explained. The first magnetic layer 43 may correspond to a storage layer (SL). In an implementation, the free layer may include an SAF (synthetic antiferromagnet) structure. The first magnetic layer 43 may include a single-layer or a multi-layer structure having a ferromagnetic material. For example, the first magnetic layer 43 may include an alloy including Fe, Ni or Co. The first magnetic layer 43 may include an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a combination thereof. The first magnetic layer 43 may include a stack structure such as Co/Pt or Co/Pd. In some implementations, the first magnetic layer 43 may include a Co—Fe—B alloy.

In some implementations, the first magnetic layer 43 may cover the first auxiliary layer 41. One surface of the first magnetic layer 43 may be in direct contact with the first auxiliary layer 41. In some implementations, the first auxiliary layer 41 and the first magnetic layer 43 may be alternately and repeatedly stacked.

The tunnel barrier layer 45 may cover the first magnetic layer 43. One surface of the tunnel barrier layer 45 may be in direct contact with the first magnetic layer 43. The tunnel barrier layer 45 may include an oxide such as MgO, CaO, SrO, TiO, VO or NbO, or a combination thereof. In some implementations, the tunnel barrier layer 45 may include MgO.

The mask pattern 47 may include a photoresist pattern formed through a lithography process. The mask pattern 47 may cover the first auxiliary layer 41, the first magnetic layer 43 and the tunnel barrier layer 45. For example, the mask pattern 47 may cover portions of the first auxiliary layer 41, the first magnetic layer 43 and the tunnel barrier layer 45.

Figure 3:
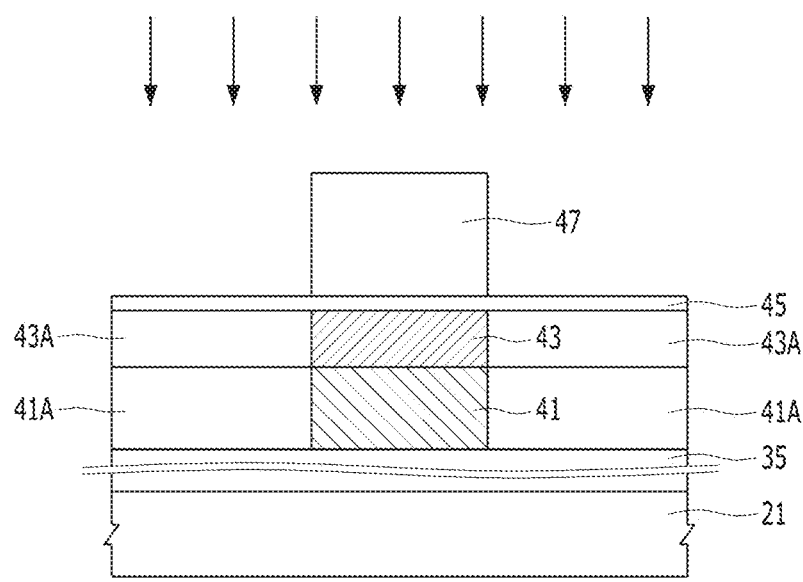

Referring to FIGS. 1 and 3, oxidation patterns 41A and 43A may be formed (B30). The oxidation patterns 41A and 43A may include a first oxidation pattern 41A and a second oxidation pattern 43A.

The oxidation patterns 41A and 43A may be formed through an ion implantation process in which oxygen is implanted into the first magnetic layer 43 and the first auxiliary layer 41 by using a mask pattern 47 as a mask. The ion implantation process may be performed by using a variety of ion implantation energies and ion implantation angles. For example, the ion implantation process may include implanting oxygen into the first magnetic layer 43 and the first auxiliary layer 41 in a direction perpendicular to the surface of the substrate 21. The first oxidation pattern 41A and the second oxidation pattern 43A may be aligned on the outside of the mask pattern 47. The first oxidation pattern 41A may be vertically aligned under the second oxidation pattern 43A.

The first auxiliary layer 41 and the first magnetic layer 43 may be confined under the mask pattern 47 by the first oxidation pattern 41A and the second oxidation pattern 43A. The first oxidation pattern 41A may include an oxide of a material included in the first auxiliary layer 41. The first oxidation pattern 41A may be in continuity with the side of the first auxiliary layer 41. For example, in FIG. 3, the first oxidation pattern 41A may adjoin the first auxiliary layer 41 on both sides of the first auxiliary layer 41 such that there exists no space between the first oxidation pattern 41A and the first auxiliary layer 41. The second oxidation pattern 43A may include an oxide of a material included in the first magnetic layer 43. The second oxidation pattern 43A may be in continuity with the side of the first magnetic layer 43. For example, in FIG. 3, the second oxidation pattern 43A may adjoin the first magnetic layer 43 on both sides of the first magnetic layer such that there exists no space between the second oxidation pattern 43A and the first magnetic layer 43.

After forming the first oxidation pattern 41A and the second oxidation pattern 43A, the mask pattern 47 may be removed. The tunnel barrier layer 45 may be exposed by removing the mask pattern 47.

Before or after removing of the mask pattern 47, a heat treatment process for materially stabilizing the oxidation patterns 41A and 43A may be performed.

Figure 4:
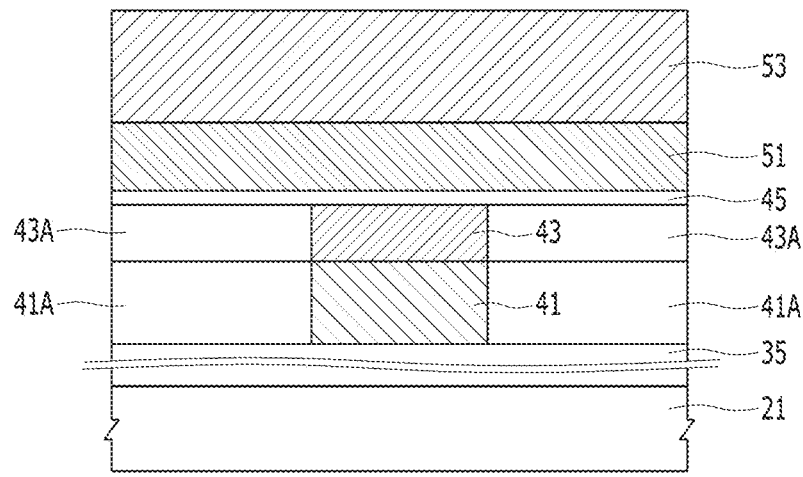

Referring to FIGS. 1 and 4, a second magnetic layer 51 and a second auxiliary layer 53 may be formed over the tunnel barrier layer 45 (B40).

The second magnetic layer 51 may cover the tunnel barrier layer 45. One surface of the second magnetic layer 51 may be in direct contact with the tunnel barrier layer 45. The second magnetic layer 51 may include any one of the free layer and the pinned layer which is different from the first magnetic layer 43. Hereinbelow, an example in which the first magnetic layer 43 includes the free layer and the second magnetic layer 51 includes the pinned layer will be exemplarily explained. The other implementation that the first magnetic layer includes the free layer and the first magnetic layer 43 includes the pinned layer is also possible. The tunnel barrier layer 45 may be interposed between the first magnetic layer 43 and the second magnetic layer 51.

The second magnetic layer 51 may correspond to a reference layer (RL). In some implementations, the pinned layer may include an SAF (synthetic antiferromagnet) structure. The second magnetic layer 51 may include a single-layer or a multi-layer structure having a ferromagnetic material. For example, the second magnetic layer 51 may include an alloy based on Fe, Ni or Co. The second magnetic layer 51 may include an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a combination thereof. The second magnetic layer 51 may include a stack structure such as Co/Pt or Co/Pd. In some implementations, the second magnetic layer 51 may include a Co—Fe—B alloy.

The second auxiliary layer 53 may cover the second magnetic layer 51. One surface of the second auxiliary layer 53 may be in direct contact with the second magnetic layer 51. The second auxiliary layer 53 may include an electrode layer, a seed layer, a spacer layer, a magnetic correction layer, a shift cancelling layer (SCL), an etch stop layer or capping layer, or a combination thereof. In some implementations, the second auxiliary layer 53 may include the SCL and the capping layer formed over the SCL. The SCL may have a magnetization direction anti-parallel to a magnetization direction of the pinned layer in order to offset or reduce a stray magnetic field generated by the pinned layer. The SCL may serve to alleviate generation of a biased magnetic field by an influence of the stray magnetic field in the pinned layer. The SCL may include CoPt, CoPd, FePt, or FePd, or a combination thereof. In some implementations, the SCL may include a CoPt layer. The capping layer may include a metal layer such as Ru.

In some implementations, the second magnetic layer 51 and the second auxiliary layer 53 may be repeatedly and alternately stacked.

Figure 5:
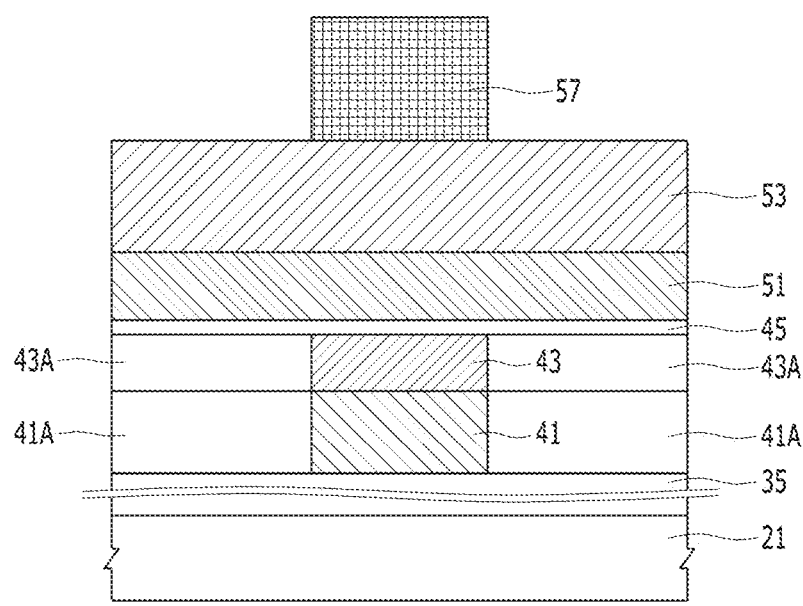

Referring to FIGS. 1 and 5, a hard mask 57 may be formed over the second auxiliary layer 53 (B50). The hard mask 57 may be formed by using a process for forming a layer and patterning the layer. The hard mask 57 may include a metal layer such as W. In some implementations, the hard mask 57 may be formed to cover a portion of the second auxiliary layer 53 and a portion of the second auxiliary layer 53 may be exposed in an area where the hard mask 57 is not formed. For example, in FIG. 5, the surface of the second auxiliary layer 53 is exposed on both sides of the second auxiliary layer 53.

Figure 6:
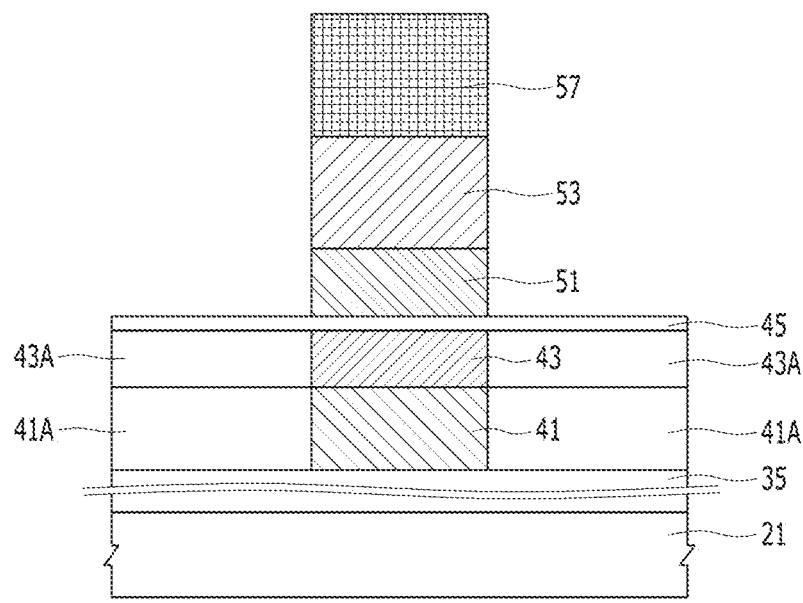

Referring to FIGS. 1 and 6, the second auxiliary layer 53 and the second magnetic layer 51 may be patterned (B60). For patterning the second auxiliary layer 53 and the second magnetic layer 51, an anisotropic etch process may be applied by using the hard mask 57 as an etch mask. The second auxiliary layer 53 and the second magnetic layer 51 may remain under the hard mask 57. Side surfaces of the second auxiliary layer 53 and side surfaces of the second magnetic layer 51 may be substantially flush with side surfaces of the hard mask 57. Referring to FIG. 6, the side surface of the second auxiliary layer 53 are aligned with the side surfaces of the second magnetic layer 51. On each side of the patterned structure including the second magnetic layer 51 and the second auxiliary layer 53, the side surfaces of the second magnetic layer 51 and the second auxiliary layer 53 form a continuous side wall. Since the second magnetic layer 51, the second auxiliary layer 53, and the hard mask 57 are positioned above a portion of the tunnel barrier layer 45, the tunnel barrier layer 45 may be exposed in a remaining portion where the hard mask 57, the second auxiliary layer 53, and the second magnetic layer 51 are not formed over the tunnel barrier layer 45.

Figure 7:
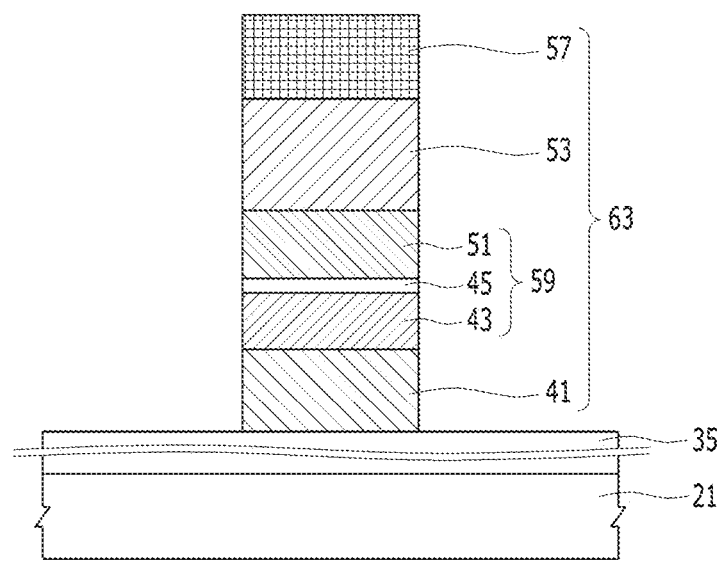

Referring to FIGS. 1 and 7, the tunnel barrier layer 45 may be patterned and the oxidation patterns 41A and 43A may be removed (B70). The first magnetic layer 43, the tunnel barrier layer 45, and the second magnetic layer 51 may form an MTJ (magnetic tunnel junction) structure 59. The MTJ structure 59, the first auxiliary layer 41, the second auxiliary layer 53 and the hard mask 57 may form a variable resistance element 63. The hard mask 57 may function as an upper electrode.

In some implementations, an anisotropic etch process in which the hard mask 57 is used as an etch mask may be applied in order to pattern the tunnel barrier layer 45 and remove the oxidation patterns 41A and 43A. Since the oxidation patterns 41A and 43A include oxides, it is possible to prevent metal materials from being re-deposited on side surfaces of the MTJ 59 during removing the oxidation patterns 41A and 43A. During the removal of the oxidation patterns 41A and 43A, metal materials disposed around the oxidation patterns 41A and 43A may be exposed. For example, the first auxiliary layer 41 and the first magnetic layer 43 may include metal materials and such metal materials can be exposed during the removal of the oxidation patterns 41A and 43A. Since the oxidation patterns 41A and 43A include oxides, the oxidation patterns 41A and 43A may have a high etch selectivity to the metal materials. Since the oxidation patterns 41A and 43A include oxides, it is possible to prevent the metal materials from being damaged by the etching for removing the oxidation patterns 41A and 43A. Thus, it is possible to prevent the metal materials from being damaged by the etching for removing the oxidation patterns 41A and 43A without an additional etch stop layer. Accordingly, the additional etch stop layer can be omitted. In accordance with implementations of the present disclosure, properties of the variable resistance element 63 can be significantly improved in comparison with the prior art and production efficiency of the semiconductor device having the variable resistance element 63 can be maximized.

Figure 8:
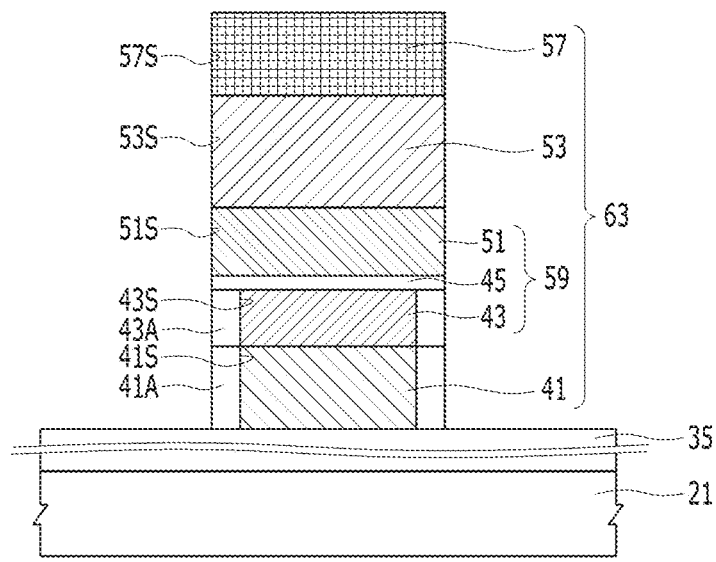

The disclosed technology provide various designs for the variable resistance element. FIGS. 8 to 11 show various resistance element with different designs from that in FIG. 7. Referring to FIG. 8, a horizontal width of the hard mask 57 may be greater than a horizontal width of the first auxiliary layer 41 and a horizontal width of the first magnetic layer 43. The second auxiliary layer 53, the second magnetic layer 51, and the tunnel barrier layer 45 may be vertically aligned under the hard mask 57. The first oxidation pattern 41A may remain on side surfaces 41S of the first auxiliary layer 41, and the second oxidation pattern 43A may remain on side surfaces 43S of the first magnetic layer 43.

Side surfaces 53S of the second auxiliary layer 53, side surfaces 51S of the second magnetic layer 51, and side surfaces 57S of the hard mask 57 may be substantially flush with one another. The side surfaces 51S, 53S, and 57S of the second magnetic layer 51, the second auxiliary layer 53, and the hard mask 57 are aligned with one another such that the side surfaces 51S, 53S, and 57S form a continuous side wall. The side surfaces 41S of the first auxiliary layer 41 and the side surfaces 43S of the first magnetic layer 43 may be substantially flush with each other. The side surfaces 41S and 43S of the first auxiliary layer 41 and the first magnetic layer 43 are aligned with each other such that the side surfaces 41S and 43S form a continuous side wall. The side surfaces 41S of the first auxiliary layer 41 and the side surfaces 43S of the first magnetic layer 43 may deviate from the side surfaces 53S of the second auxiliary layer 53, the side surfaces 51S of the second magnetic layer 51, and the side surfaces 57S of the hard mask 57. The continuous side wall formed by the side surfaces 41S and 43S are not aligned with the continuous side wall formed by the side surfaces 51S, 53S and 57S. Outer side surfaces of the oxidation patterns 41A and 43A may be substantially flush with the side surfaces 53S of the second auxiliary layer 53, the side surfaces 51S of the second magnetic layer 51, and the side surfaces 57S of the hard mask 57. Outer side surfaces of the oxidation patterns 41A and 43A are aligned with the side surfaces 51S, 53S and 57S of the second magnetic layer 51, the second auxiliary layer 53, and the hard mask 57.

Figure 9:
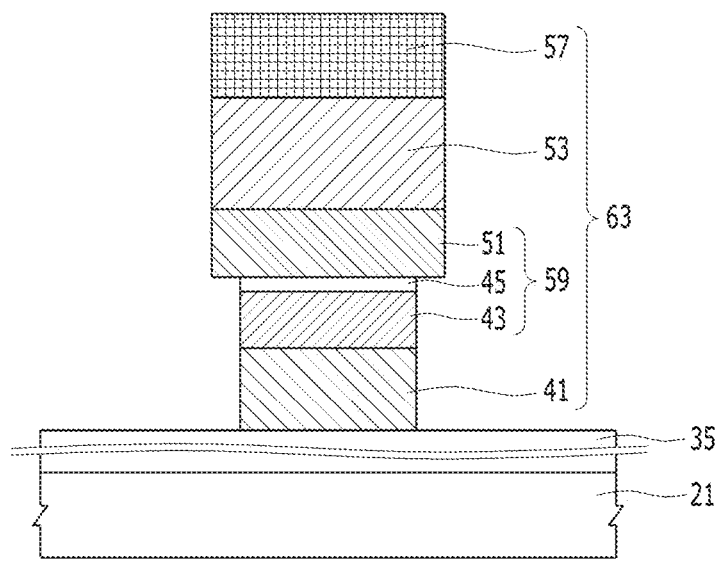

Referring to FIG. 9, horizontal widths of the first auxiliary layer 41, the first magnetic layer 43, and the tunnel barrier layer 45 may be smaller than horizontal widths of the second magnetic layer 51, the second auxiliary layer 53, and the hard mask 57.

Figure 10:
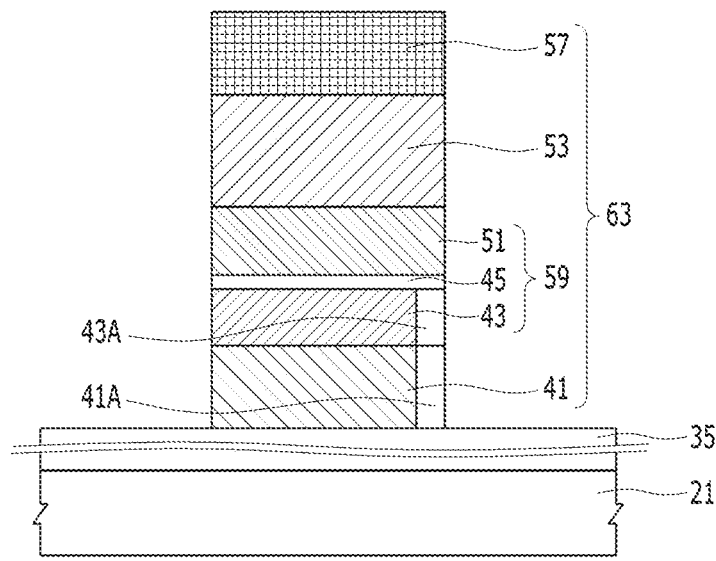

Referring to FIG. 10, vertical center axes of the first auxiliary layer 41 and the first magnetic layer 43 may deviate from vertical center axes of the second auxiliary layer 53, the second magnetic layer 51, and the hard mask 57. The first oxidation pattern 41A may remain on a side surface of the first auxiliary layer 41, and the second oxidation pattern 43A may remain on a side surface of the first magnetic layer 43.

Figure 11:
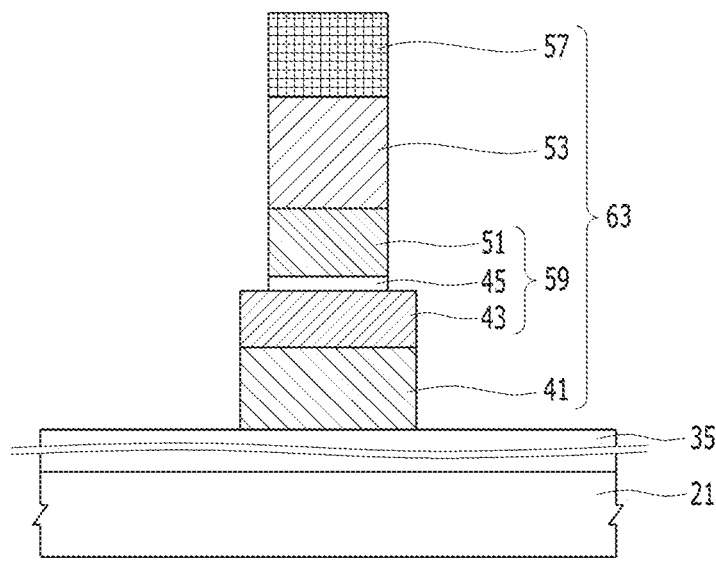

Referring to FIG. 11, horizontal widths of the first auxiliary layer 41 and the first magnetic layer 43 may be greater than horizontal widths of the tunnel barrier layer 45, the second magnetic layer 51, the second auxiliary layer 53, and the hard mask 57, respectively.

Figure 12:
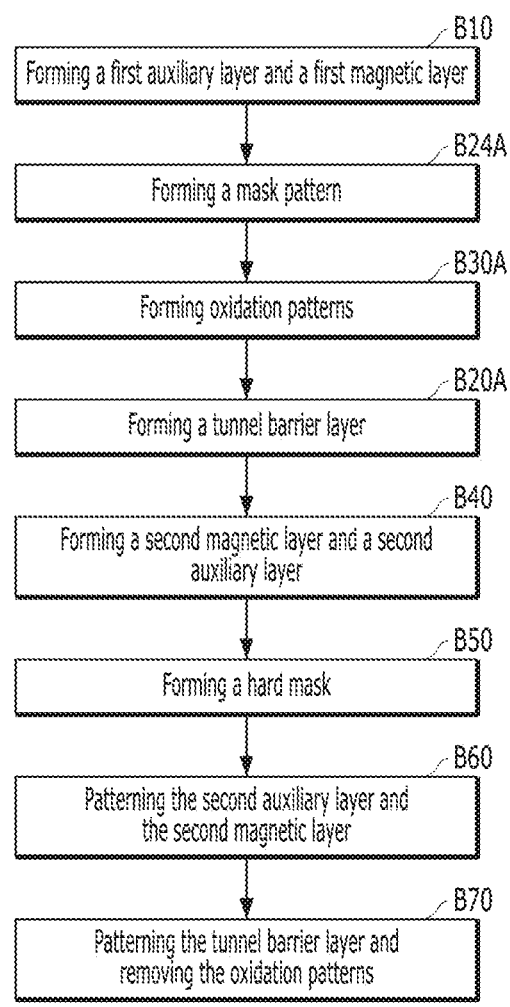
FIG. 12 is a flow-chart explaining a method for fabricating a semiconductor device including a variable resistance element based on an implementation of the disclosed technology.
Figure 13:
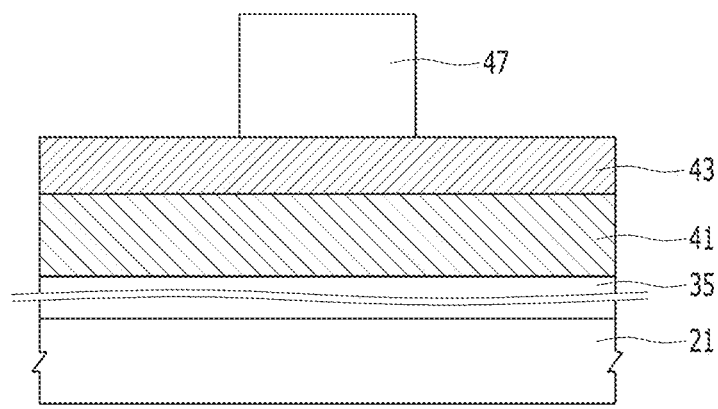
FIGS. 13 to 15 are cross-sectional views illustrating a method for fabricating a semiconductor device including a variable resistance element and a related electronic device based on an implementation of the disclosed technology.
Figure 14:
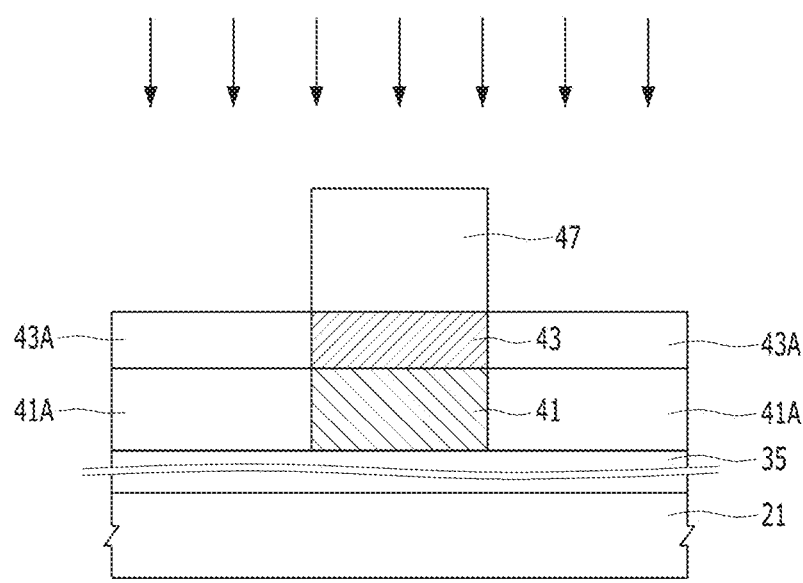
Figure 15:
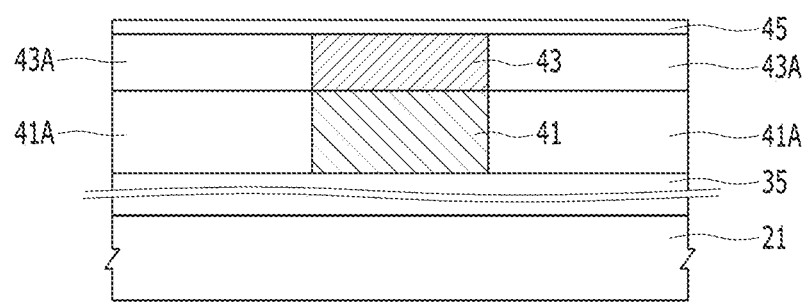

FIG. 12 is a flow-chart explaining a method for fabricating a semiconductor device including a variable resistance element based on an implementation of the present disclosure. FIGS. 13 to 15 are cross-sectional views illustrating the method for fabricating the semiconductor device and a related electronic device.

Referring to FIG. 12, the method for fabricating the semiconductor device including the variable resistance element based on the implementation of the present disclosure may include forming a first auxiliary layer and a first magnetic layer (B10), forming a mask pattern (B24A), forming oxidation patterns (B30A), forming a tunnel barrier layer (B20A), forming a second magnetic layer and a second auxiliary layer (B40), forming a hard mask (B50), patterning the second auxiliary layer and the second magnetic layer (B60), and patterning tunnel barrier layer and removing the oxidation patterns (B70).

Referring to FIGS. 12 and 13, a first dielectric layer 35 may be formed over a substrate 21. A first auxiliary layer 41 and a first magnetic layer 43 may be formed over the first dielectric layer 35 (B10). A mask pattern 47 may be formed over the first magnetic layer 43 (B24A).

Referring to FIGS. 12 and 14, oxidation patterns 41A and 43A may be formed (B30A). The oxidation patterns 41A and 43A may include a first oxidation pattern 41A and a second oxidation pattern 43A.

The first magnetic layer 43 may be exposed by removing the mask pattern 47.

A cleaning process for removing oxides formed on the surface of the first magnetic layer 43 may be performed.

Referring to FIGS. 12 and 15, a tunnel barrier layer 45 may be formed over the first magnetic layer 43 and the second oxidation pattern 43A (B20A). Then, the semiconductor device including the variable resistance element may be formed by a method similar to the method explained with reference to FIGS. 1 to 11.

Figure 16:
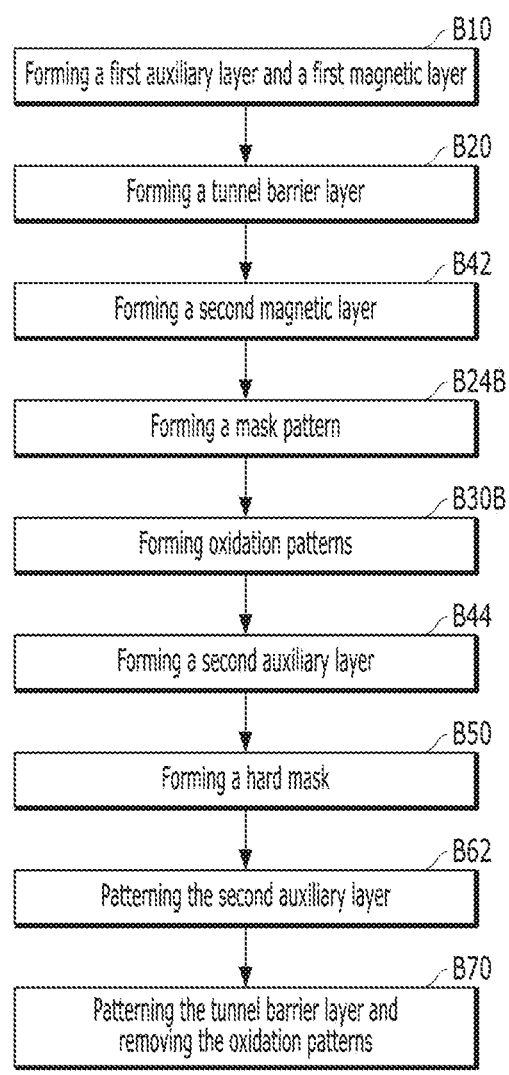
FIG. 16 is a flow-chart explaining a method for fabricating a semiconductor device including a variable resistance element based on an implementation of the disclosed technology.

FIG. 16 is a flow-chart explaining a method for fabricating a semiconductor device including a variable resistance element based on an implementation of the present disclosure. FIGS. 17 to 26 are cross-sectional views illustrating the method for fabricating the semiconductor device and a related electronic device.

Referring to FIG. 16, the method for fabricating the semiconductor device including the variable resistance element based on the implementation of the present disclosure may include forming a first auxiliary layer and a first magnetic layer (B10), forming a tunnel barrier layer (B20), forming a second magnetic layer (B42), forming a mask pattern (B24B), forming oxidation patterns (B30B), forming a second auxiliary layer (B44), forming a hard mask (B50), patterning the second auxiliary layer (B62), patterning the tunnel barrier layer and removing the oxidation patterns (B70).

Figure 17:
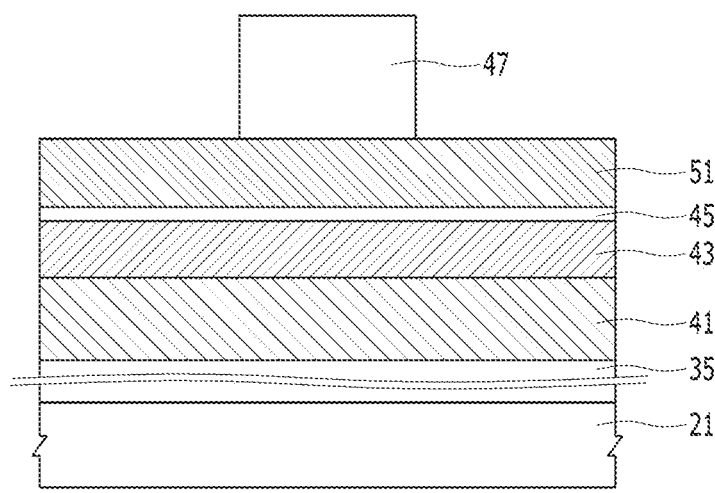
FIGS. 17 to 26 are cross-sectional views illustrating a method for fabricating a semiconductor device including a variable resistance element and a related electronic device based on an implementation of the disclosed technology.

Referring to FIGS. 16 and 17, a first dielectric layer 35 may be formed over a substrate 21. A first auxiliary layer 41 and a first magnetic layer 43 may be formed over the first dielectric layer 35 (B10). A tunnel barrier layer 45 may be formed over the first magnetic layer 43 (B20). A second magnetic layer 51 may be formed over the tunnel barrier layer 45 (B42). A mask pattern 47 may be formed over the second magnetic layer 51 (B24B).

Figure 18:
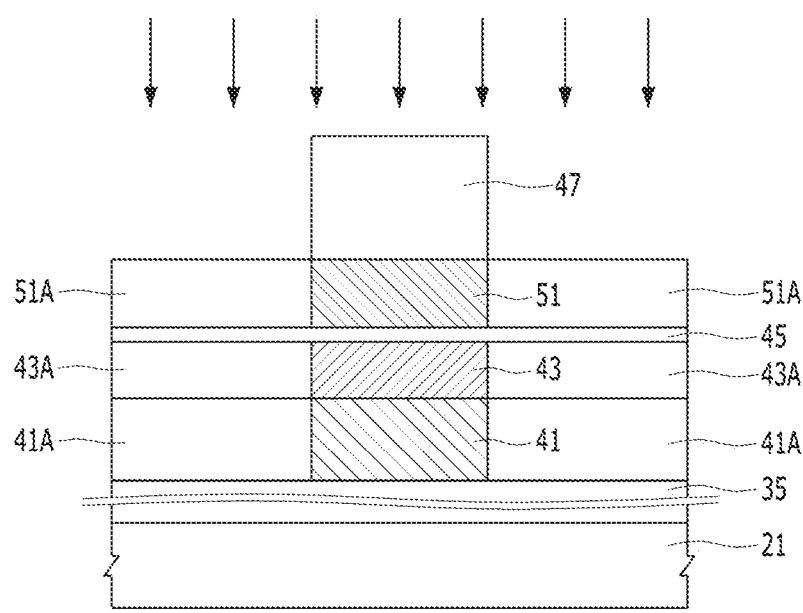

Referring to FIGS. 16 and 18, oxidation patterns 41A, 43A and 51A may be formed (B30B). The oxidation patterns 41A, 43A and 51A may include a first oxidation pattern 41A, a second oxidation pattern 43A, and a third oxidation pattern 51A. The second magnetic layer 51 may be located or confined under the mask pattern 47 and the third oxidation pattern 51A is formed on both sides of the second magnetic layer 51. The third oxidation pattern 51A may include an oxide of a material included in the second magnetic layer 51. The third oxidation pattern 51A may be in continuity with side surfaces of the second magnetic layer 51. For example, in FIG. 18, the third oxidation pattern 51A may adjoin the third oxidation pattern 51 on both sides of the third oxidation pattern 51 such that there exists no space between the third oxidation pattern 51A and the third oxidation pattern 51. A method similar to the method explained with reference to FIG. 3 may be used to form the oxidation patterns 41A, 43A and 51A.

The second magnetic layer 51 may be exposed by removing the mask pattern 47.

A cleaning process for removing oxides formed on the surface of the second magnetic layer 51 may be performed.

Figure 19:
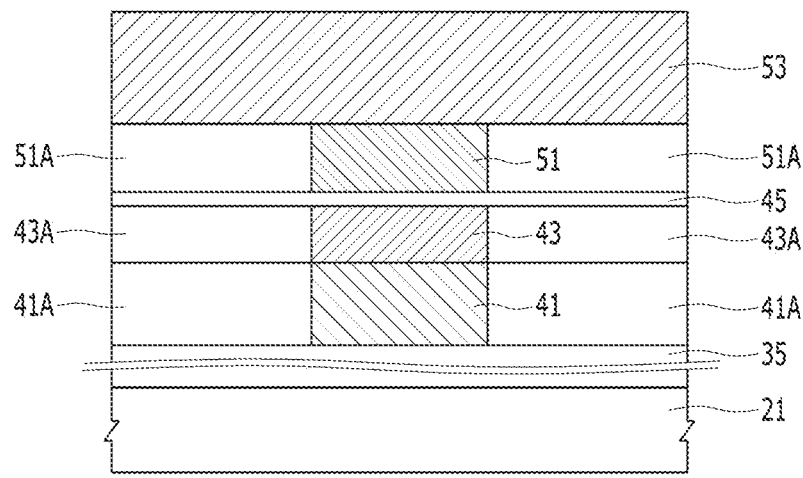

Referring to FIGS. 16 and 19, a second auxiliary layer 53 may be formed over the second magnetic layer 51 and the third oxidation pattern 51A (B44).

Figure 20:
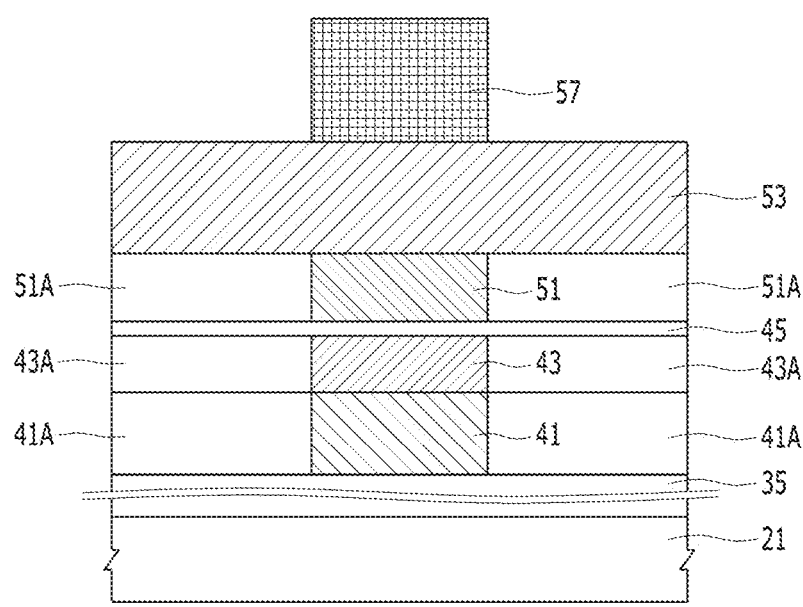

Referring to FIGS. 16 and 20, a hard mask 57 may be formed over the second auxiliary layer 53 (B50).

Figure 21:
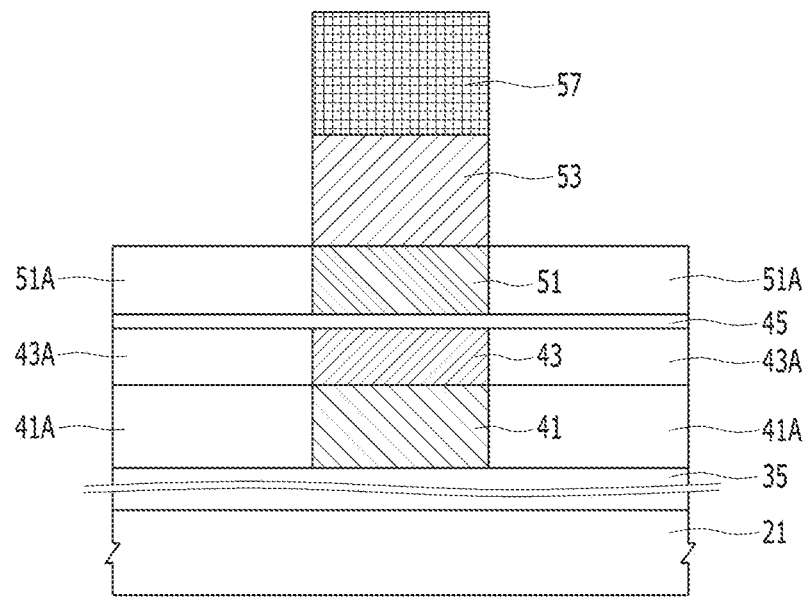

Referring to FIGS. 16 and 21, the second auxiliary layer 53 may be patterned (B62). The second auxiliary layer 53 may be vertically aligned under the hard mask 57. Since the hard mask 57 and the second auxiliary layer 53 are positioned above the second magnetic layer 51, the third oxidation pattern 51A may be exposed while not being covered by the hard mask 57 and the second auxiliary layer 53.

Figure 22:
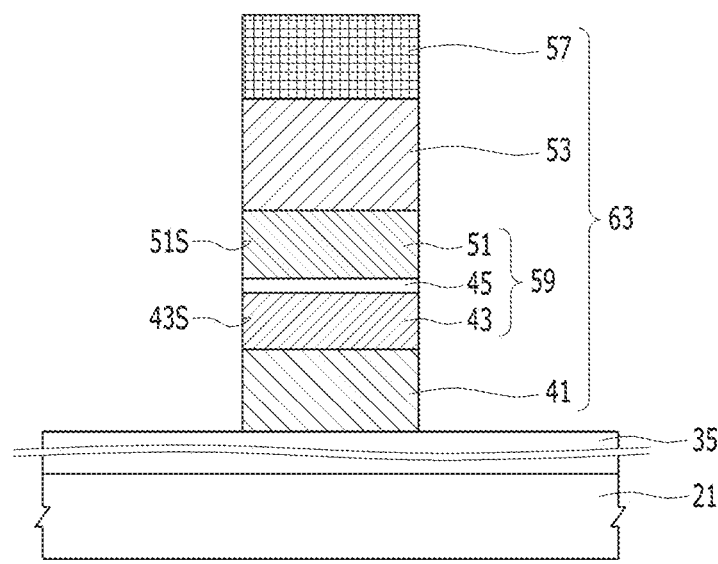

Referring to FIGS. 16 and 22, the third oxidation pattern 51A may be removed, the tunnel barrier layer 45 may be patterned, the second oxidation pattern 43A may be removed, and the first oxidation pattern 41A may be removed (B70). The first magnetic layer 43, the tunnel barrier layer 45, and the second magnetic layer 51 may form an MTJ structure 59. The MTJ structure 59, the first auxiliary layer 41, the second auxiliary layer 53 and the hard mask 57 may form a variable resistance element 63. The hard mask 57 may function as an upper electrode.

Side surfaces 43S of the first magnetic layer 43 may be vertically aligned with side surfaces 51S of the second magnetic layer 51. The side surfaces 43S of the first magnetic layer 43 may be substantially flush with or aligned with the side surfaces 51S of the second magnetic layer 51.

Figure 23:
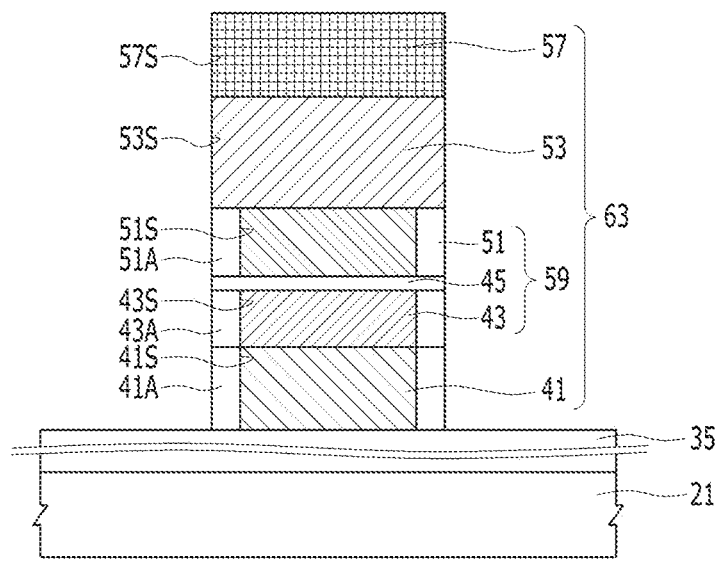

The disclosed technology provide various designs for the variable resistance element. FIGS. 23 to 26 show various resistance element with different designs from that in FIG. 7. Referring to FIG. 23, horizontal widths of the hard mask 57 and the second auxiliary layer 53 may be greater than horizontal widths of the first auxiliary layer 41, the first magnetic layer 43, and the second magnetic layer 51. The first oxidation pattern 41A may remain on the side surfaces 41S of the first auxiliary layer 41, the second oxidation pattern 43A may remain on the side surfaces 43S of the first magnetic layer 43, and the third oxidation pattern 51A may remain on the side surfaces 51S of the second magnetic layer 51.

Side surfaces 53S of the second auxiliary layer 53 may be substantially flush with or aligned with side surfaces 57S of the hard mask 57. The side surfaces 41S of the first auxiliary layer 41, the side surfaces 43S of the first magnetic layer 43, and the side surfaces 51S of the second magnetic layer 51 may be substantially flush with or aligned with one another. The side surfaces 41S of the first auxiliary layer 41, the side surfaces 43S of the first magnetic layer 43, and the side surfaces 51S of the second magnetic layer 51 may deviate from or not aligned with the side surfaces 53S of the second auxiliary layer 53 and the side surfaces 57S of the hard mask 57. Outer side surfaces of the oxidation patterns 41A, 43A and 51A may be substantially flush with or aligned with the side surfaces 53S of the second auxiliary layer 53 and the side surfaces 57S of the hard mask 57.

Figure 24:
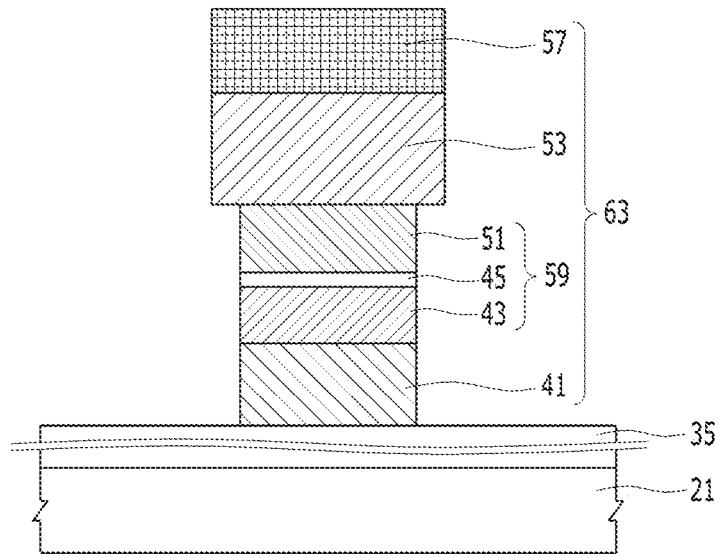

Referring to FIG. 24, horizontal widths of the first auxiliary layer 41, the first magnetic layer 43, the tunnel barrier layer 45, and the second magnetic layer 51 may be smaller than horizontal widths of the second auxiliary layer 53 and the hard mask 57.

Figure 25:
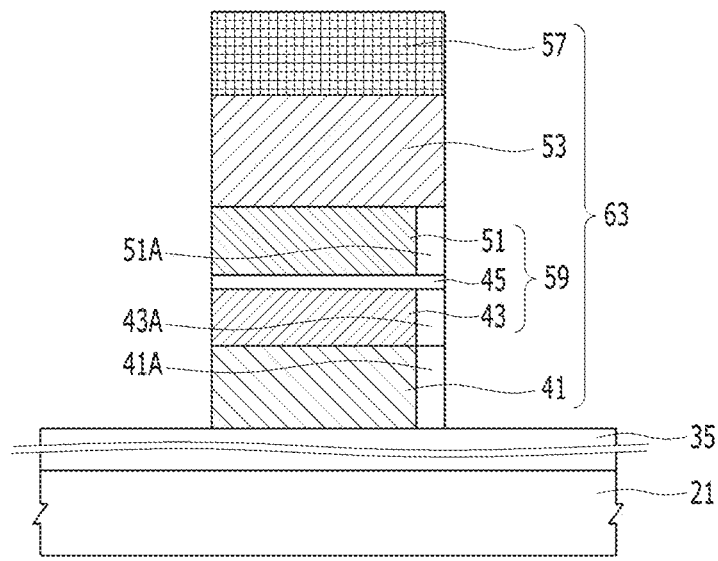

Referring to FIG. 25, vertical center axes of the first auxiliary layer 41, the first magnetic layer 43, and the second magnetic layer 51 may deviate from vertical center axes of the second auxiliary layer 53 and the hard mask 57. The first oxidation pattern 41A may remain on side surfaces of the first auxiliary layer 41, the second oxidation pattern 43A may remain on a side surface of the first magnetic layer 43, and the third oxidation pattern 51A may remain on a side surface 51S of the second magnetic layer 51.

Figure 26:
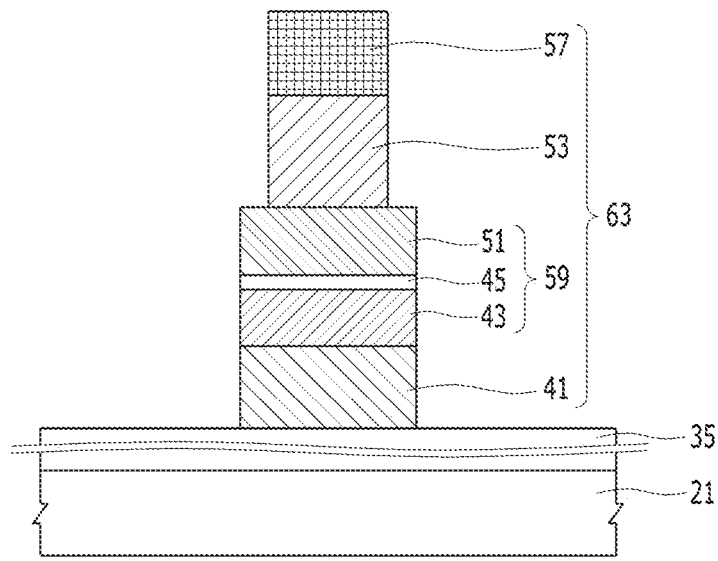

Referring to FIG. 26, horizontal widths of the first auxiliary layer 41, the first magnetic layer 43, the tunnel barrier layer 45, and the second magnetic layer 51 may be greater than horizontal widths of the second auxiliary layer 53 and the hard mask 57.

Figure 27:
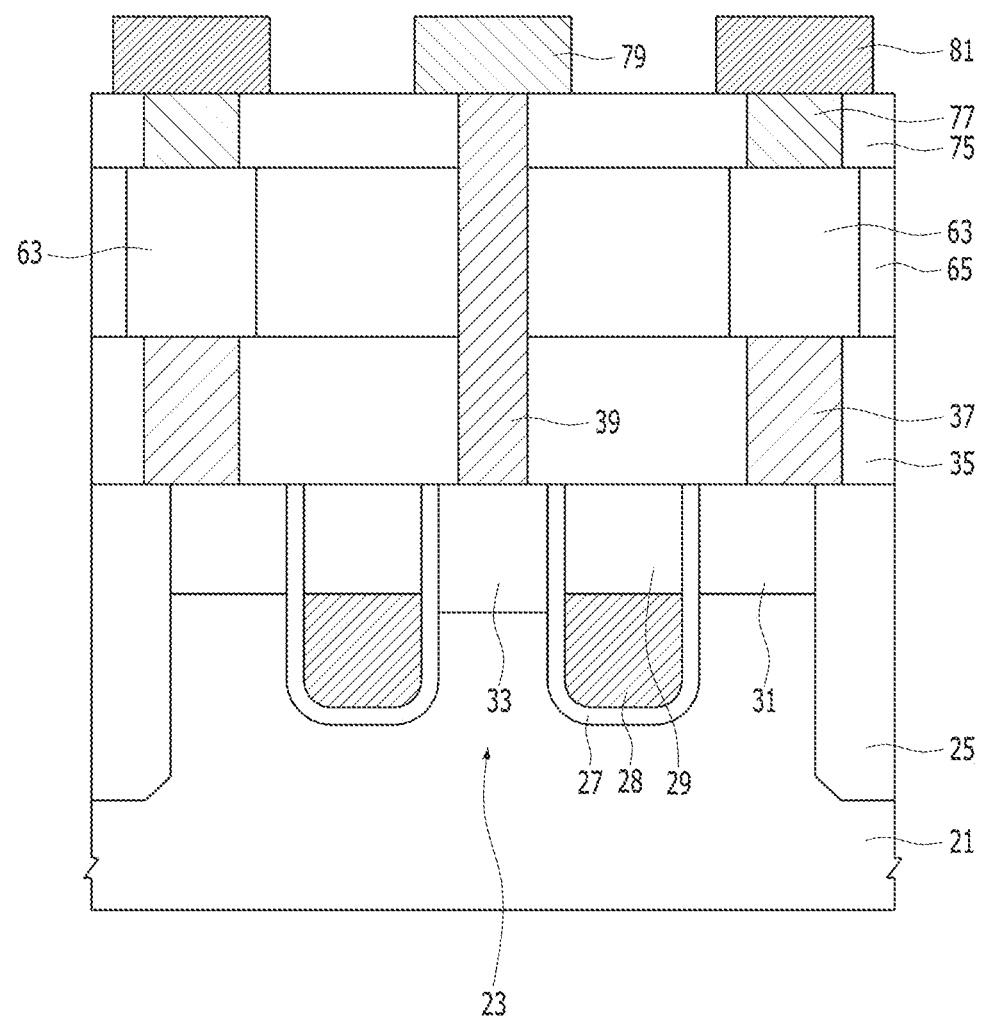
FIG. 27 is a cross-sectional view illustrating a method for fabricating a semiconductor device including a variable resistance element and a related electronic based on an implementation of the disclosed technology.

FIG. 27 is a cross-sectional view illustrating a method for fabricating a semiconductor device including a variable resistance element and a related electronic device based on an implementation of the present disclosure.

Referring to FIG. 27, the semiconductor device based on an implementation of the present disclosure may include a substrate 21, an active region 23, a device isolation layer 25, a gate dielectric layer 27, a gate electrode 28, a gate capping layer 29, a drain region 31, a source region 33, a first dielectric layer 35, a lower plug 37, a source plug 39, a variable resistance element 63, a second dielectric layer 65, a third dielectric layer 75, an upper plug 77, a source line 79, and a bit line 81.

The device isolation layer 25 confining the active region 23 may be formed over the substrate 21. The substrate 21 may be a semiconductor substrate such as a silicon wafer or a silicon on insulator (SOI) wafer. The device isolation layer 25 may be formed by a shallow trench isolation (STI) process. The device isolation layer 25 may include a dielectric material such as silicon oxide, silicon nitride, or silicon oxynitride, or a combination thereof.

The gate dielectric layer 27, the gate electrode 28, the gate capping layer 29, the drain region 31, and the source region 33 may be formed in the active region 23. An upper end of the gate electrode 28 may be formed at the level lower than upper ends of the drain region 31 and the source region 33. The gate capping layer 29 may cover the gate electrode 28. The active region 23, the gate dielectric layer 27, the gate electrode 28, the drain region 31, and the source region 33 may form a recess channel transistor. The recess channel transistor may function as a switching element.

In some implementations, the switching element may include a 3-dimensional transistor, a vertical transistor, a finFET, a nanowire transistor, a planar transistor, or a diode, or a combination thereof, instead of the recess channel transistor.

The gate dielectric layer 27 may include a dielectric material such as silicon oxide, silicon nitride, silicon oxynitride, or high-K dielectrics, or a combination thereof. The gate electrode 28 may include a conductive material such as polysilicon, a metal, a metal nitride, a metal oxide, a metal silicide, or conductive carbon, or a combination thereof. The gate capping layer 29 may include a dielectric material such as silicon oxide, silicon nitride, or silicon oxynitride, or a combination thereof. The drain region 31 and the source region 33 may be formed by implanting impurities into the active region 23. For example, the active region 23 may include p-type impurities, and the drain region 31 and the source region 33 may include n-type impurities.

The first dielectric layer 35, the second dielectric layer 65, and the third dielectric layer 75 may be sequentially stacked over the substrate 21 having the recess channel transistor and the device isolation layer 25. The first dielectric layer 35, the second dielectric layer 65, and the third dielectric layer 75 may include a dielectric material such as silicon oxide, silicon nitride, silicon oxynitride, or low-K dielectrics, or a combination thereof.

The lower plug 37 may be formed so as to pass through the first dielectric layer 35 and be coupled to the drain region 31. The lower plug 37 may include a conductive material such as polysilicon, a metal, a metal nitride, a metal oxide, a metal silicide, or conductive carbon, or a combination thereof. The variable resistance element 63 coupled to the lower plug 37 may be formed in the second dielectric layer 65. The variable resistance element 63 may be formed by a method similar to the method explained with reference to FIGS. 1 to 26. The upper plug 77 may be formed so as to pass through the third dielectric layer 75 and be coupled to the variable resistance element 63. The upper plug 77 may include a conductive material such as polysilicon, a metal, a metal nitride, a metal oxide, a metal silicide, or conductive carbon, or a combination thereof.

The source plug 39 may be formed so as to pass through the third dielectric layer 75, the second dielectric layer 65, and the first dielectric layer 35 and be coupled to the source region 33. The source plug 39 may include a conductive material such as polysilicon, a metal, a metal nitride, a metal oxide, a metal silicide, or conductive carbon, or a combination thereof. The source line 79 coupled to the source plug 39 may be formed over the third dielectric layer 75. The bit line 81 coupled to the upper plug 77 may be formed over the third dielectric layer 75. The source line 79 and the bit line 81 may include a conductive material such as a metal, a metal nitride, a metal oxide, a metal silicide, or conductive carbon, or a combination thereof.

The above and other memory circuits or semiconductor devices based on the disclosed technology can be used in a range of devices or systems. FIGS. 28 to 32 provide some examples of devices or systems that can implement the memory circuits disclosed herein.

Figure 28:
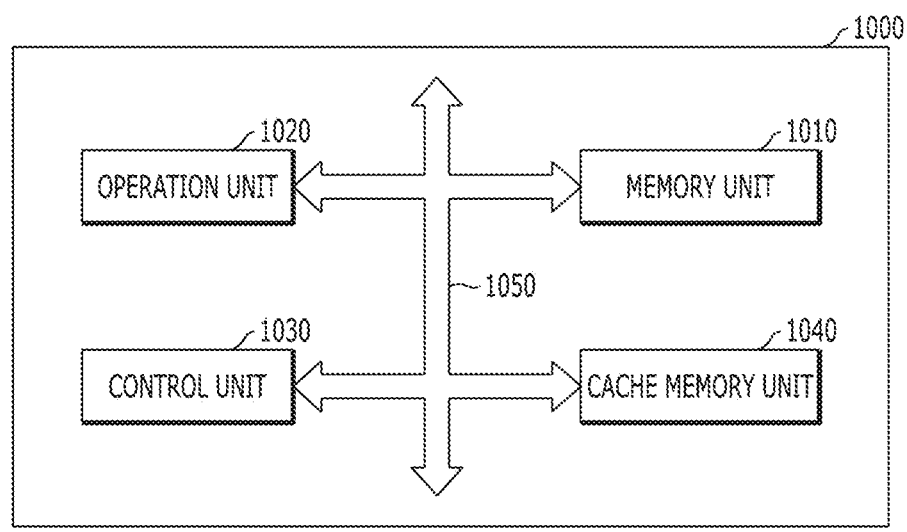
FIG. 28 is an example of configuration diagram of a microprocessor implementing memory circuitry based on the disclosed technology.

FIG. 28 is an example of configuration diagram of a microprocessor implementing memory circuitry based on the disclosed technology.

Referring to FIG. 28, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 29:
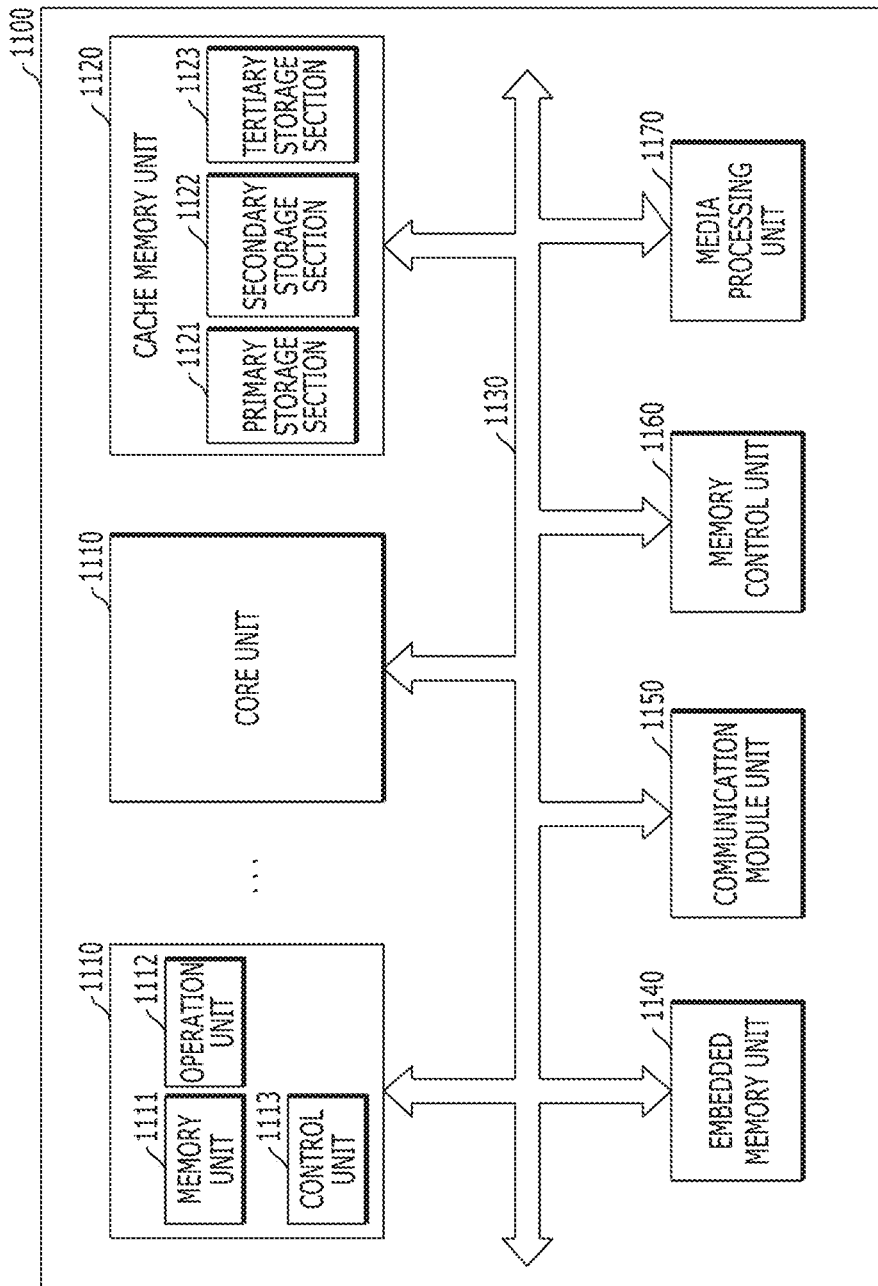
FIG. 29 is an example of configuration diagram of a processor implementing memory circuitry based on the disclosed technology.

FIG. 29 is an example of configuration diagram of a processor implementing memory circuitry based on the disclosed technology.

Referring to FIG. 29, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the cache memory unit 1120 may be improved. As a consequence, operating characteristics of the processor 1100 may be improved.

Although it was shown in FIG. 29 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 30:
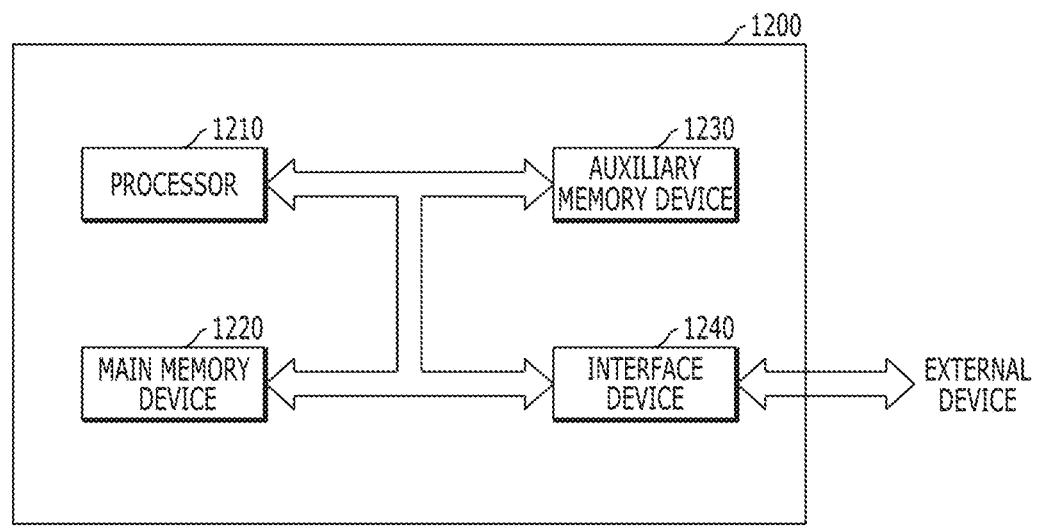
FIG. 30 is an example of configuration diagram of a system implementing memory circuitry based on the disclosed technology.

FIG. 30 is an example of configuration diagram of a system implementing memory circuitry based on the disclosed technology.

Referring to FIG. 30, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 31) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 31) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 31:
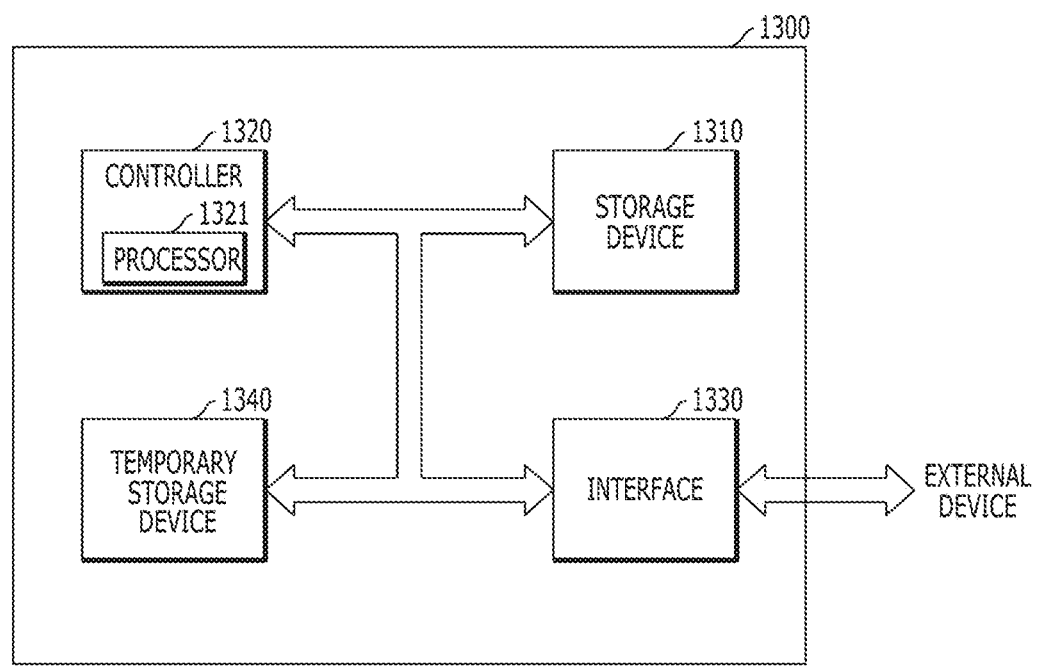
FIG. 31 is an example of configuration diagram of a data storage system implementing memory circuitry based on the disclosed technology.

FIG. 31 is an example of configuration diagram of a data storage system implementing memory circuitry based on the disclosed technology.

Referring to FIG. 31, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the storage device 1310 or the temporary storage device 1340 may be improved. As a consequence, operating characteristics and data storage characteristics of the data storage system 1300 may be improved.

Figure 32:
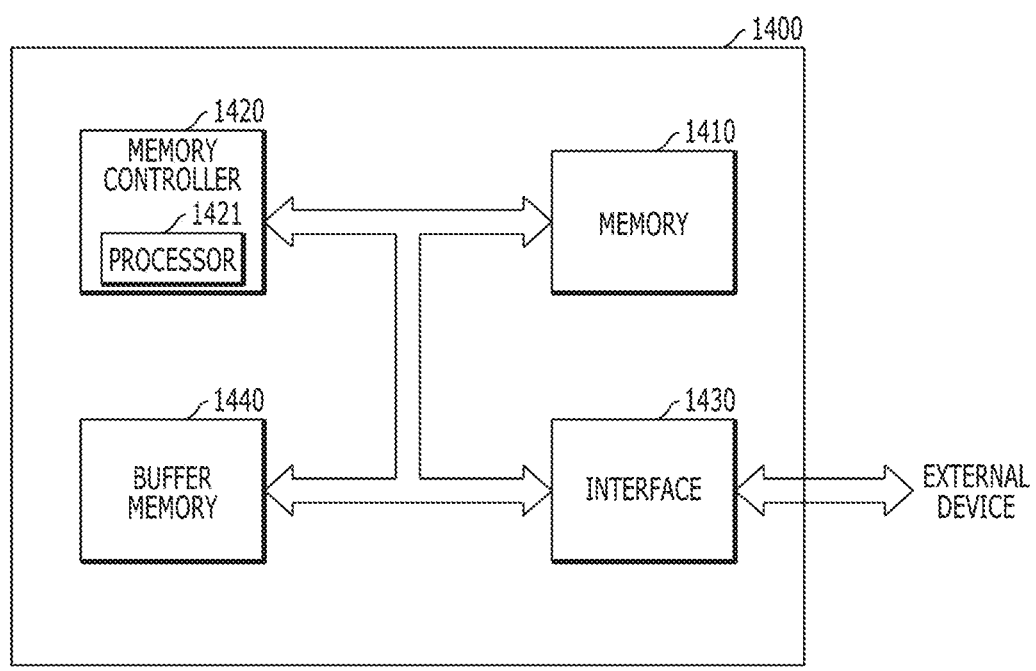
FIG. 32 is an example of configuration diagram of a memory system implementing memory circuitry based on the disclosed technology.

FIG. 32 is an example of configuration diagram of a memory system implementing memory circuitry based on the disclosed technology.

Referring to FIG. 32, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element, wherein the variable resistance element may include a first auxiliary layer; a first magnetic layer formed over the first auxiliary layer; a tunnel barrier layer formed over the first magnetic layer; a second magnetic layer formed over the tunnel barrier layer; a second auxiliary layer formed over the second magnetic layer; and a hard mask formed over the second auxiliary layer, wherein side surfaces of the first magnetic layer may be substantially aligned with side surfaces of the first auxiliary layer, and the side surfaces of the first magnetic layer may deviate from side surfaces of the hard mask. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 28-32 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises a variable resistance element,
   wherein the variable resistance element comprises,
   a first auxiliary layer;
   a first magnetic layer formed over the first auxiliary layer;
   a tunnel barrier layer formed over the first magnetic layer;
   a second magnetic layer formed over the tunnel barrier layer;
   a second auxiliary layer formed over the second magnetic layer;
   a hard mask formed over the second auxiliary layer,
   a first oxidation pattern formed on side surfaces of the first auxiliary layer; and
   a second oxidation pattern formed on the side surfaces of the first magnetic layer,
   wherein side surfaces of the first magnetic layer are substantially aligned with the side surfaces of the first auxiliary layer,
   the side surfaces of the first magnetic layer deviate from side surfaces of the hard mask,
   the first oxidation pattern includes an oxide of a material included in the first auxiliary layer, and
   the second oxidation pattern includes an oxide of a material included in the first magnetic layer.

2. The electronic device of claim 1, wherein side surfaces of the second magnetic layer, side surfaces of the second auxiliary layer, and the side surfaces of the hard mask are aligned with one another.

3. The electronic device of claim 1, wherein a horizontal width of the first magnetic layer is smaller than a horizontal width of the hard mask.

4. The electronic device of claim 1, wherein outer side surfaces of the first oxidation pattern and the second oxidation pattern are substantially aligned with the side surfaces of the hard mask.

5. The electronic device of claim 1, wherein a vertical center axis of the first magnetic layer deviates from a vertical center axis of the hard mask.

6. The electronic device of claim 1, wherein side surfaces of the second auxiliary layer are substantially aligned with the side surfaces of the hard mask,
   side surfaces of the second magnetic layer deviate from the side surfaces of the second auxiliary layer, and
   the side surfaces of the first magnetic layer are substantially flush with the side surfaces of the second magnetic layer.

7. The electronic device of claim 1, further comprising a third oxidation pattern formed on side surfaces of the second magnetic layer and including an oxide of a material included in the second magnetic layer.

8. The electronic device of claim 7, wherein outer side surfaces of the third oxidation pattern are substantially aligned with the side surfaces of the hard mask.

9. The electronic device of claim 1, wherein vertical center axes of the first magnetic layer and the second magnetic layer deviate from vertical center axes of the second auxiliary layer and the hard mask.

10. The electronic device of claim 1, wherein the first magnetic layer has one of a fixed magnetization and a variable magnetization, and
the second magnetic layer includes the other one of the fixed magnetization and the variable magnetization.

11. The electronic device of claim 1, wherein the first auxiliary layer includes an electrode layer, a seed layer, a spacer layer, a magnetic correction layer, a shift cancelling layer (SCL), or an etch stop layer, or a combination thereof, and the second auxiliary layer includes the electrode layer, the seed layer, the spacer layer, the magnetic correction layer, the shift cancelling layer (SCL), the etch stop layer, or a capping layer, or a combination thereof.

12. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

13. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

14. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

15. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

16. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *